US011133663B2

(12) United States Patent
Hanagami et al.

(10) Patent No.: US 11,133,663 B2
(45) Date of Patent: Sep. 28, 2021

(54) REVERSE CURRENT PROTECTION CIRCUIT

(71) Applicant: Apple Inc., Cupertino, CA (US)

(72) Inventors: Nathan F. Hanagami, San Francisco, CA (US); Jay B. Fletcher, Austin, TX (US)

(73) Assignee: Apple Inc., Cupertino, CA (US)

( * ) Notice: Subject to any disclaimer, the term of this patent is extended or adjusted under 35 U.S.C. 154(b) by 952 days.

(21) Appl. No.: 15/849,222

(22) Filed: Dec. 20, 2017

(65) Prior Publication Data
US 2019/0190252 A1    Jun. 20, 2019

(51) Int. Cl.
| H02H 3/18 | (2006.01) |
| H02H 9/02 | (2006.01) |
| H03K 17/0812 | (2006.01) |
| G05F 1/575 | (2006.01) |
| H03K 17/082 | (2006.01) |
| G05F 1/46 | (2006.01) |

(52) U.S. Cl.
CPC .............. *H02H 3/18* (2013.01); *G05F 1/575* (2013.01); *H02H 9/02* (2013.01); *H03K 17/0822* (2013.01); *H03K 17/08122* (2013.01); *G05F 1/46* (2013.01)

(58) Field of Classification Search
CPC ......... G05F 1/46; G05F 1/575; H02H 11/003; H02H 3/023; H02H 3/08; H02H 3/087; H02H 3/18; H02H 7/1213; H02H 9/02; H02M 1/32; H03K 17/08122; H03K 17/0822
See application file for complete search history.

(56) References Cited

U.S. PATENT DOCUMENTS

| 4,090,227 A | 5/1978 | Schweitzer |
| 5,751,140 A * | 5/1998 | Canter ..................... G05F 1/56 |
| | | 323/282 |
| 6,137,267 A | 10/2000 | Kates |
| 6,650,520 B2 | 11/2003 | He |
| 7,394,633 B2 | 7/2008 | Sasitornwannakul |
| 9,863,982 B2 * | 1/2018 | Guntreddi .......... G01R 19/0092 |
| 2014/0049238 A1 * | 2/2014 | Hu ......................... G01R 19/00 |
| | | 323/282 |
| 2017/0047731 A1 | 2/2017 | Manohar |

FOREIGN PATENT DOCUMENTS

EP    2876796 A1 *  5/2015    ............... H02H 3/18

* cited by examiner

*Primary Examiner* — Jared Fureman
*Assistant Examiner* — Nicolas Bellido
(74) *Attorney, Agent, or Firm* — Kowert, Hood, Munyon, Rankin & Goetzel, P.C.; Erik A. Heter

(57) ABSTRACT

A circuit and method for protecting from reverse current is disclosed. A reverse current protection circuit is coupled to a pass transistor of power circuitry (e.g., a power switch or voltage regulator), the pass transistor being coupled between first and second voltage nodes, the first voltage node being coupled to a power supply circuit. The reverse current protection circuit includes a sensing circuit that is configured to sense an amount of reverse current flowing through the pass transistor (from the second voltage node to the first voltage node). Responsive to the amount of reverse current exceeding a threshold value, the reverse current sensing circuit activates a shunt circuit, which redirects at least some of the reverse current to a reference node (e.g., ground).

20 Claims, 4 Drawing Sheets

REVERSE CURRENT PROTECTION CIRCUIT

BACKGROUND

Technical Field

This disclosure is directed to electronic circuits, and more particularly, to circuits for providing reverse current protection.

Description of the Related Art

Voltage regulators are commonly used in a wide variety of circuits in order to provide a desired voltage to particular circuits. To this end, a wide variety of voltage regulator circuits are available to suit various applications. Linear voltage regulators are used in a number of different applications in which the available supply voltages exceed an appropriate value for the circuitry to be powered. Accordingly, linear voltage regulators may output a voltage that is less than the received supply voltage. Switching voltage regulators may also be used to provide a voltage that is less than a received supply voltage.

In some cases, the output of voltage regulators and other types of power supply circuitry may be coupled to power switches. In particular, power switches may be used to selectively power on or off certain circuit blocks within a system or integrated circuit. Furthermore, some power switches may be used for bypassing purpose. For example, some circuits may use a power switch to enable the bypassing of a regulated voltage supply for an unregulated voltage supply.

SUMMARY

A circuit and method for protecting from reverse current is disclosed. In one embodiment, a reverse current protection circuit is coupled to a pass transistor of power circuitry (e.g., a power switch or voltage regulator), the pass transistor being coupled between first and second voltage nodes, the first voltage node being coupled to a power supply circuit. The reverse current protection circuit includes a sensing circuit that is configured to sense an amount of reverse current flowing through the pass transistor (from the second voltage node to the first voltage node). Responsive to the amount of reverse current exceeding a threshold value, the reverse current sensing circuit activates a shunt circuit, which redirects at least some of the reverse current to a reference node (e.g., ground).

In one embodiment, a method includes sensing circuitry sensing an amount of reverse current flowing through the pass transistor of a power circuit. The method further includes the sensing circuit causing activation of a shunt circuit responsive to the amount of reverse current exceeding a threshold value. Activation of the shunt circuit redirects at least some of the reverse current away from the pass transistor.

BRIEF DESCRIPTION OF THE DRAWINGS

The following detailed description makes reference to the accompanying drawings, which are now briefly described.

Figure 1:
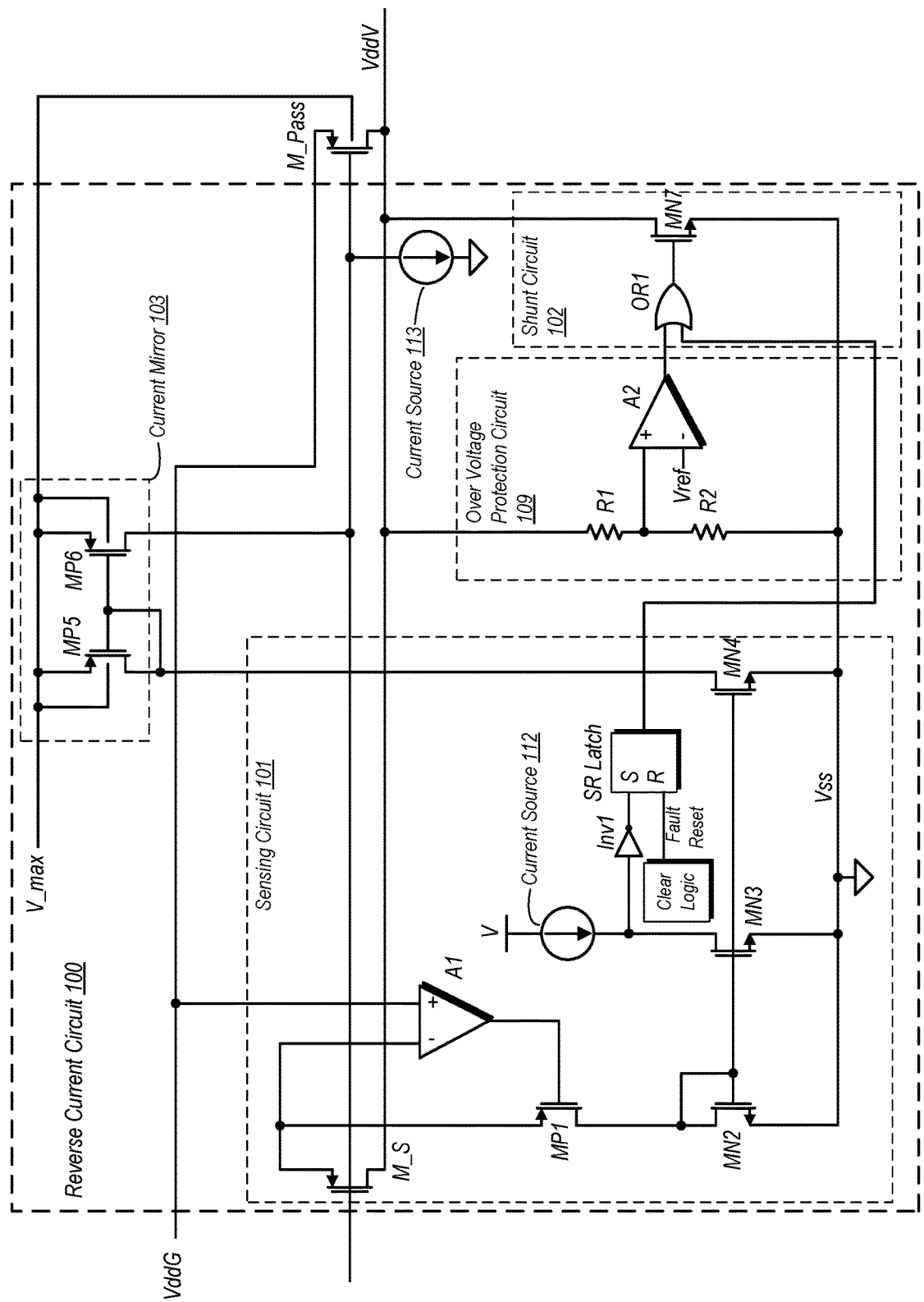
FIG. 1 is a schematic diagram of one embodiment of a circuit including a reverse current sensing circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently, being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, schematic diagram of one embodiment of a circuit that includes a reverse current sensing circuit is illustrated. In the embodiment shown, reverse current circuit 100 is coupled to a pass transistor, M_Pass. The pass transistor is part of another circuit, and more particularly a circuit related to the distribution of power. For example, M_Pass may be a pass transistor utilized in a power switch that couples two voltage nodes together, and that can be used for power gating when inactive. In another embodiment, M_Pass can be a pass transistor implemented in a voltage regulator. In general, M_Pass can be a transistor utilized in virtually any kind of power circuitry which receives an input voltage and provides an output voltage. Additionally, while M_Pass as shown herein is implemented as a PMOS transistor, embodiments are possible and contemplated in which this transistor may be implemented as an NMOS transistor.

The pass transistor as shown here is coupled between two different voltage nodes (labeled here as VddG and VddV). The voltage node VddG is considered an input voltage node, while VddV is the output voltage node. The voltage node VddG may be coupled to, for example, an external power supply. The voltage node VddV may be coupled to, for example, a load circuit or some type of functional circuit block.

During operation and for various reasons, reverse currents may pass through the pass transistor. A reverse current as defined in the context of FIG. 1 may be a current flowing from VddV to VddG. More generally, a reverse current in the context of this disclosure may be defined as a current that flows through a pass transistor in a direction that is opposite of what is intended or desirable. Reverse currents flowing back into a power supply are typically considered to be undesirable and can adversely affect operation of the power supply and circuitry coupled thereto. Accordingly, reverse current circuit 100 is coupled to the pass transistor in order to minimize the effects of any reverse currents that otherwise may flow from VddV back to VddG.

Reverse current circuit 100 as shown herein may be divided into a number of different circuit blocks. The circuit blocks in this particular embodiment are sensing circuit 101, shunt circuit 102, current mirror 103, and over voltage protection circuit 109. It is noted that the over voltage protection circuit is optional, and some embodiments may not include circuitry that performs this function. Sensing circuit 101 is used in this embodiment to sense an amount of reverse current and to trigger the shunt circuit should the reverse current exceed a threshold amount. The shunt circuit, when activated, redirects at least some of the reverse current from VddV to a reference node (Vss in this embodiment). Current mirror 103 in the embodiment shown applies a current to the gate terminal of M_Pass, and may pull the voltage on this gate terminal toward another voltage (V_max in this case) in proportion to the amount of reverse current sensed by sensing circuit 101. This may limit the current that is allowed to flow back into M_Pass by increasing its impedance to reverse current. Overvoltage protection circuit 109 in the embodiment shown may respond to an overvoltage condition on VddV to activate the shunt circuit 102 and thus reduce the voltage to a point that the over-voltage condition no longer exists. This may counteract one of the causes of reverse currents, namely an occurrence in which the voltage present on VddV is becomes greater than that present on VddG. These various circuit units are now described in more detail.

Sensing circuit 100 in the embodiment shown includes a sense transistor M_S. In this particular embodiment, M_S is implemented as a PMOS transistor, but like M_Pass, may be implemented as an NMOS transistor in other embodiments. The gate terminals of both M_S and M_Pass are coupled to a common node, while the drain terminals of both of these devices are coupled to Vdd_V. Accordingly, the voltages present on the respective gate and drain terminals of these devices is substantially the same during operation.

Amplifier A1 of sensing circuit 101 includes an inverting input and a non-inverting input, and is part of a current steering circuit. The inverting input of amplifier A1 is coupled to the source terminal of M_S, while the non-inverting input is coupled to voltage node VddG. The output of amplifier A1 is coupled to the gate terminal of transistor MP1, the source node of which is coupled to the source node of the sense transistor M_S. It is noted that, in the embodiment shown, these two connections are the only connections for the source node of M_S, i.e. the source of M_S is not coupled to a voltage node or any other node than those shown here. Amplifier A1 generates an output signal to drive MP1 depending on the amount of current through M_S, and more particularly, the amount of current flowing from VddV. Thus, the current through MP1 in the embodiment shown is proportional to the current flowing from VddV, and thus proportional to the reverse current through M_Pass.

Transistor MP1 in the embodiment shown is coupled to a current mirror circuit, and more particularly, to the diode-coupled transistor MN2 of the current mirror. The current through MN2 in this embodiment is mirrored to two different devices, MN3 and MN4. Accordingly, the current through these devices is also proportional to the current through MP1 and thus the current flowing through M_S and the reverse current.

Transistor MN3 in the illustrated embodiment of sensing circuit 101 is coupled to another current source, current source 112. Current source 112 in the embodiment shown is configured to generate a fixed current. The fixed current provided by current source 112 effectively sets a threshold value used to determine whether to trigger the shunt circuit due to reverse current through the pass transistor. Both current source 112 and the source terminal of MN3 are coupled to the input of inverter Inv1, the output of which is in turn coupled to the 'S' input of a set-reset (SR) latch. The respective currents through MN3 and current source 112 oppose one another, and thus are used to determine if the reverse current has exceeded a threshold value. In this particular embodiment, if the current through MN3 exceeds the fixed current provided by current source 112, the input to Inv1 falls low, thereby causing its output to assert a set signal on the set ('S') input of the SR latch. When the set input is asserted, the output of the SR latch propagates through the OR gate OR1 to the gate of a shunt transistor MN7, thereby activating this device. Otherwise, if the fixed current provided by current source 112 is greater than the current through MN3, the input to Inv1 is high, its output is low, and the set signal is not asserted.

The reset ('R') input of the SR latch may be asserted by the signal 'Fault Reset', which is output from the Clear Logic as shown in the drawing. In one embodiment, the assertion of Fault Reset results from the reverse current falling below a second threshold that is less than the first threshold. Although not explicitly shown, reverse current circuit 100 may include additional circuitry for monitoring the reverse current and causing the clear logic to generate the Fault Reset signal when the reverse current is less than the second threshold. In general, any kind of suitable circuitry may be used for determining if the reverse current has fallen below the second threshold. In another possible embodiment, a single threshold may be used, and Fault Reset may be asserted whenever the fixed current from current source 112 exceeds the current through MN3.

As previously noted, the current through MN2 is also mirrored through transistor MN4. The source terminal of MN4 is coupled to another current mirror, current mirror 103. In this particular embodiment, the drain terminal of MN4 is coupled to the drain terminal of MP5, which is the diode-coupled device of current mirror 103. The current through MP5, which depends on the current through MP4, is mirrored to MP6. The drain terminal of MP6 is coupled to the gate terminal of the pass transistor, M_Pass. Additionally, another current source, current source 113, is coupled between the gate terminal of M_Pass and ground. The balance of the drain current in MP6 and that of current source 113 may effectively program an amount of reverse current that is allowed after a reverse current event occurs. If M_Pass attempts to increase its through current at any point after the current through MP6 is equal to that of current source 113, MP6 will pull the gate terminal higher and thereby increase the impedance provided by the pass transistor.

The respective source terminals of MP5 and MP6 are coupled to another voltage node, labeled here as V_max.

The voltage on V_max may be provided by any suitable voltage generation circuitry. In one embodiment, V_max is the maximum voltage of VddG and VddV, e.g., V_max may be equal to VddG. More generally V_max may be set high enough to allow MP6 to pull the gate of M_Pass high enough to turn off the pass transistor. It is further noted, as depicted in FIG. 1, that both M5 and MP6 are body-coupled devices, with their respective bodies being coupled to V_Max.

Depending on the current mirrored from MP5 (which in turn depends on the current mirrored to MP4), MP6 may cause the gate terminal of M_Pass to be pulled toward V_Max. The amount that the voltage is raised on the gate terminal of M_Pass depends on the amount of current through MP6. The current through M_Pass, including any reverse current, may depend on the voltage present on its respective gate terminal. Accordingly, raising the voltage even a small amount may help to reduce reverse current flowing through M_Pass.

Shunt circuit 102 in the embodiment shown includes OR gate OR1 and shunt transistor MN7. Shunt transistor MN7 is coupled between VddV and Vss in the embodiment shown. When activated, MN7 redirects current to Vss that might otherwise become reverse current through M_Pass. Additionally, the activation of MN7 may also serve to reduce the voltage on VddV. Activation of MN7 may be caused by assertion of the output signal from OR1, which can occur when at least one of the SR latch or amplifier A2 provides a logic high signal to its respectively coupled input of the logic gate.

Over voltage protection circuit 109 in the embodiment shown includes resistors R1 and R2, arranged as a voltage divider, and amplifier A2. The non-inverting input of amplifier A2 is coupled to the node at the junction of R1 and R2. Accordingly, the non-inverting input of A2 is coupled to receive a voltage that is somewhere between the voltage present on VddV and that present on Vss. The inverting input of A2 in the illustrated embodiment is coupled to receive a reference voltage, Vref. This reference voltage may be generated by any suitable voltage source/circuitry. Amplifier A2 in this embodiment effectively acts as a voltage comparator. When Vref is greater than the voltage at the junction of R1 and R2, the output of A2 is low, effectively a logic zero. However, if the voltage on VddV rises enough, the voltage at the junction of R1 and R2 will exceed that of Vref, causing A2 to output a high that is effectively a logic one. The logic one may propagate through OR1 to the gate of MN7 to activate this device. As noted above, the activation of MN7 may pull the voltage on VddV toward Vss. Accordingly, overvoltage protection circuit 109 may help mitigate reverse currents by counteracting overvoltage conditions in which the voltage of VddV exceeds that of VddG. As previously noted, the inclusion of the over voltage protection circuit 109 is optional, and thus embodiments are possible in which circuitry with a similar function is not present.

Figure 2:
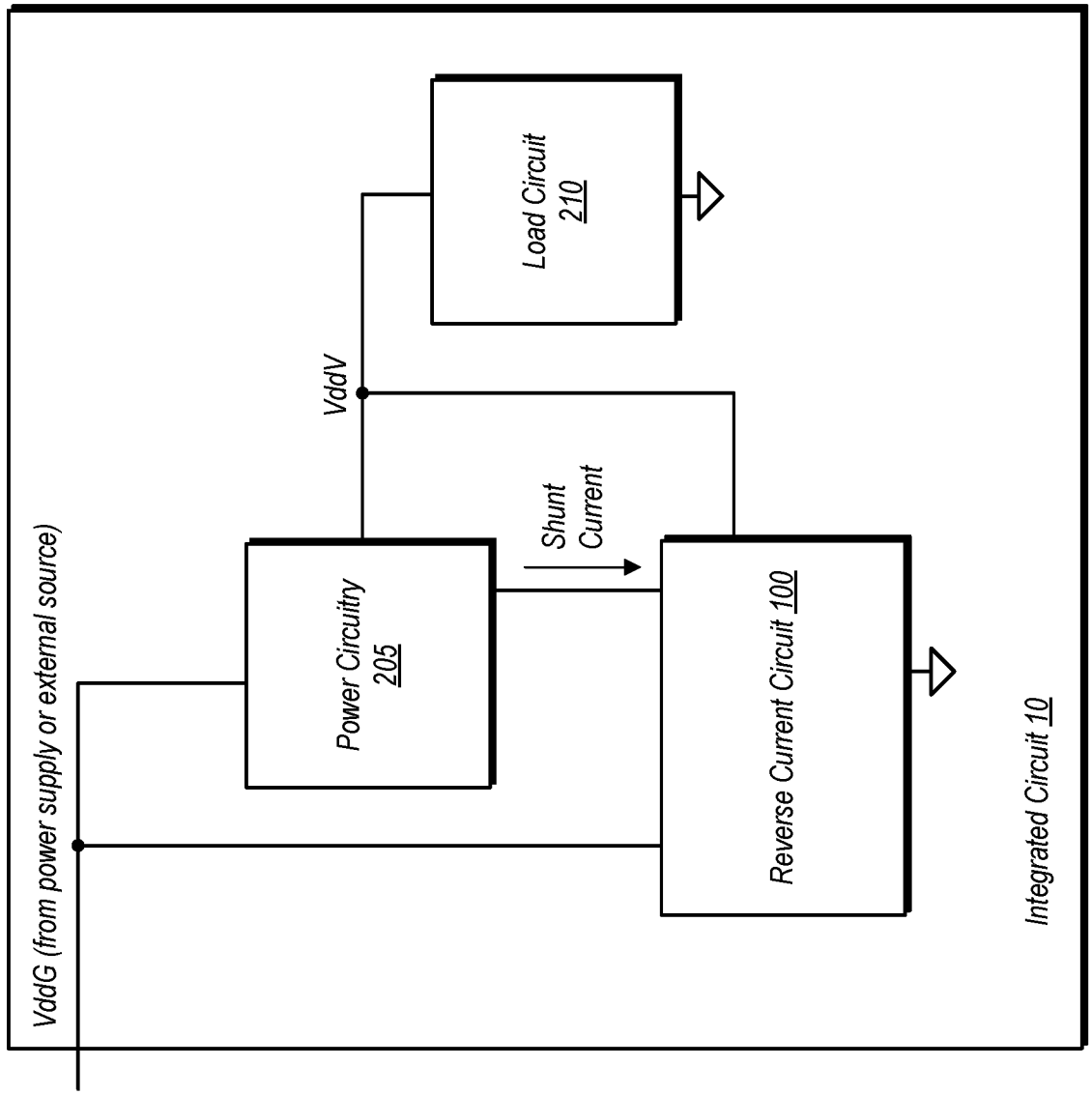
FIG. 2 is a block diagram of one embodiment of an integrated circuit including a power circuit and a reverse current sensing circuit.

FIG. 2 is a block diagram of one embodiment of an integrated circuit having a reverse current protection circuit implemented therein. In the embodiment shown, integrated circuit 10 includes power circuitry 205, a load circuit 210, and reverse current protection circuit 100. The load circuit 210 in the embodiment shown may be any type of functional circuit block implemented on an integrated circuit, and may include digital, analog, and/or mixed signal circuitry. The power circuitry 205 in the embodiment shown may be any type of power distribution circuitry that includes a pass transistor. Such circuitry could be a voltage regulator, a power switch, or other type of power distribution circuitry. The power circuitry 205 as shown here is coupled to receive an external voltage via VddG, and is configured to output a corresponding voltage VddV that is used as the supply voltage for load circuit 210.

Reverse current circuit 100 is coupled to detect reverse currents flowing from VddV to VddG, and thus back into the power supply/external voltage source. Responsive to detecting reverse currents, reverse current circuit 100 may activate a shunt circuit to shunt current away from the VddV node to a reference node, such as Vss or ground. This may mitigate, if not eliminate, the reverse current that was detected. Upon determining that the reverse current has been largely mitigated, reverse current 100 may de-activate the shunt current path but continue monitoring for reverse currents. In one embodiment, reverse current circuit 100 may be implemented in the same manner as discussed above and shown in FIG. 1. However, other embodiments of a reverse current circuit are also possible and contemplated.

Figure 3:
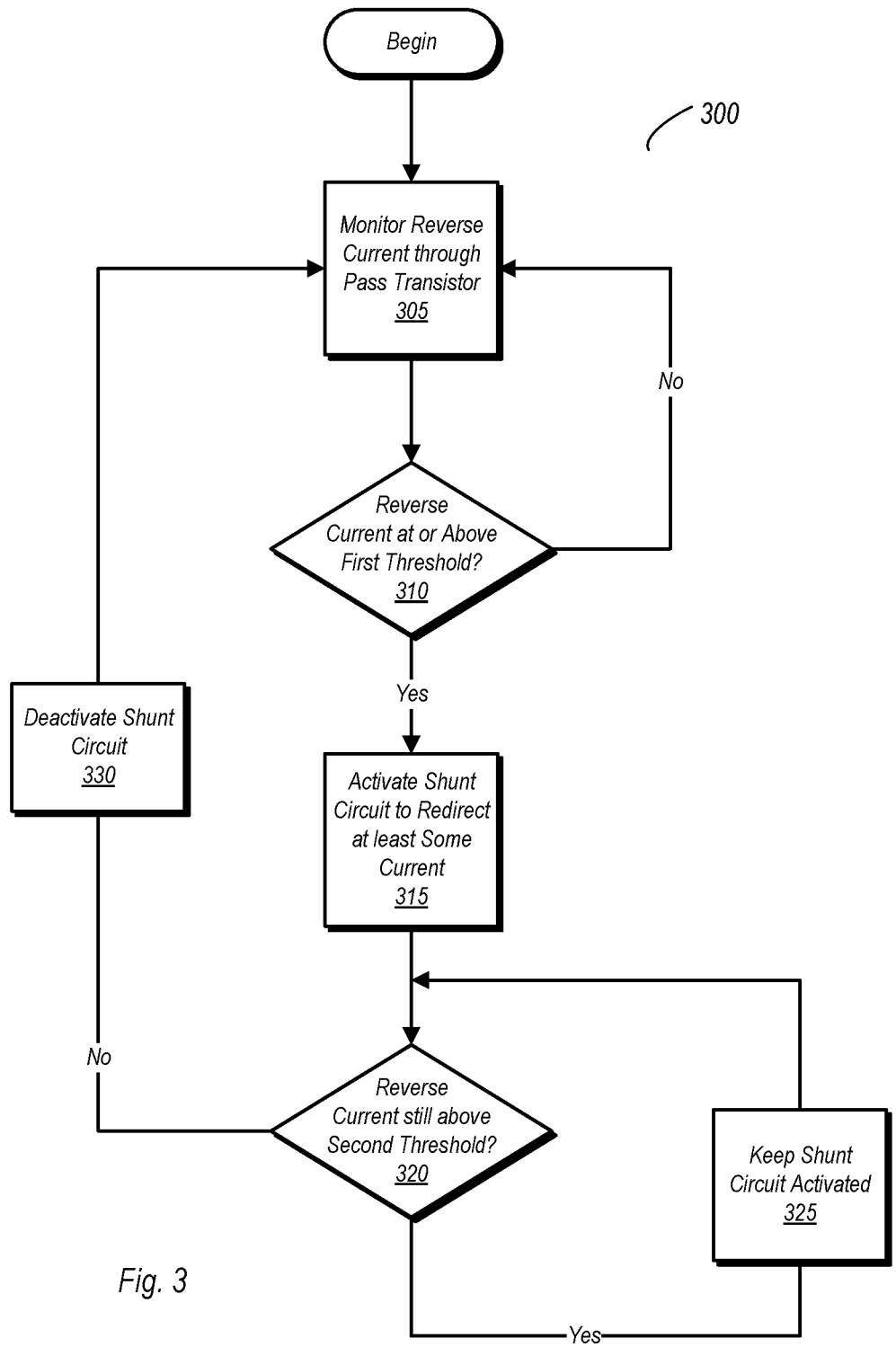
FIG. 3 is a flow diagram of one embodiment of a method for operating a reverse current sensing circuit.

FIG. 3 is a flow diagram illustrating one embodiment of a method for operating a reverse current protection circuit. Method 300 may be implemented using various embodiments of the circuitry as discussed above. Additionally, method 300 may be implemented with other circuit embodiments not explicitly discussed herein, which may nevertheless fall within the scope of this disclosure.

In method 300, reverse current through a pass transistor are monitored (block 305). If the reverse current through a pass transistor is at or above a first threshold (block 310, yes), then a shunt circuit is activated to redirect at least some (if not all) of the reverse current (block 315). Otherwise, if the reverse current is below the first threshold (block 310, no), monitoring continues at block 305.

If, after activating the shunt circuit (in block 315) the reverse current remains above a second threshold that is less than the first, (block 320, yes), the shunt circuit remains activated (block 325). Once the reverse current is no longer above the second threshold (block 320, no), the shunt circuit is deactivated (block 330) and the monitoring of reverse currents continues per block 305.

Figure 4:
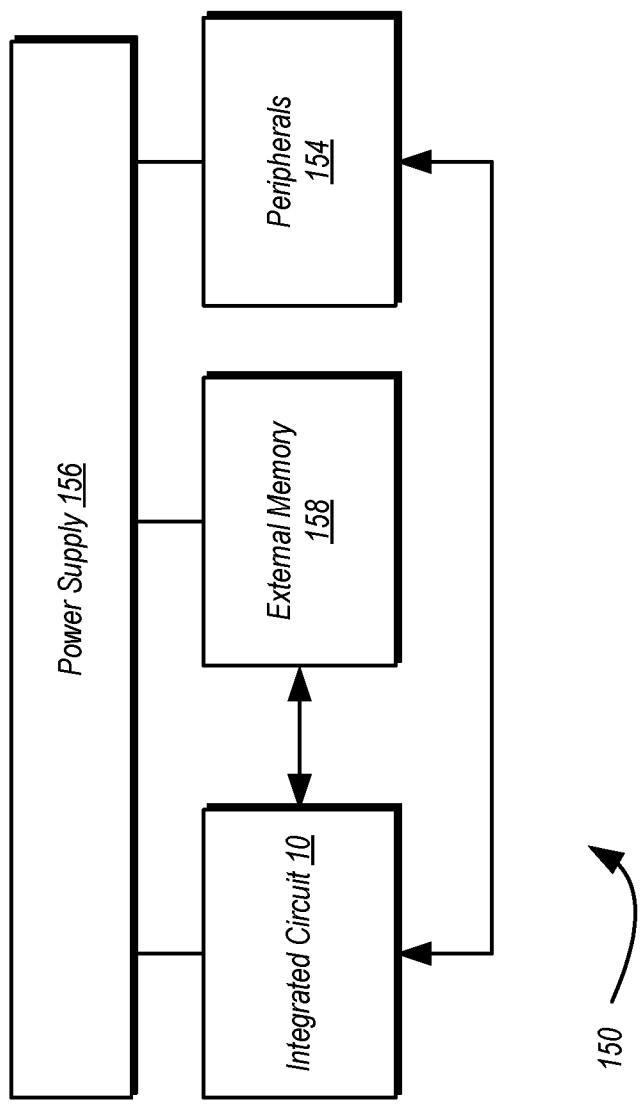
FIG. 4 is a block diagram of one embodiment of an exemplary system.

Turning next to FIG. 4, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
    a pass transistor coupled between a first voltage node and a second voltage node, wherein the first voltage node is coupled to a power supply;
    a sensing circuit configured to sense an amount of reverse current, the reverse current being a current fed back through the pass transistor to the power supply, wherein the sensing circuit includes a sense transistor and a current steering circuit, wherein the current steering circuit is configured to generate a current based on an amount of reverse current detected, wherein the current steering circuit includes a first amplifier and a current steering transistor having a gate terminal coupled to an output of the first amplifier, wherein an inverting input of the first amplifier and a source terminal of the current steering transistor are coupled to a source terminal of the sense transistor, wherein a non-inverting input of the first amplifier is coupled to the first voltage node, and wherein a drain terminal of the sense transistor is coupled to the second voltage node; and
    a shunt circuit, wherein responsive to detecting that the reverse current exceeds a threshold value, the sensing circuit is configured to cause activation of the shunt circuit to redirect at least a portion of the reverse current to a reference node.

2. The circuit as recited in claim 1, further comprising a first current mirror coupled to receive a first current from the current steering circuit, wherein the first current mirror is configured to generate a second current.

3. The circuit as recited in claim 2, wherein the sensing circuit further comprises a first current source coupled to the first current mirror, wherein the first current source is configured to provide a third current opposing the second current.

4. The circuit as recited in claim 3, wherein the sensing circuit further comprises a set-reset latch, wherein responsive to the second current exceeding the third current, the sensing circuit is configured to cause a set signal is asserted to a set input of the set-reset latch.

5. The circuit as recited in claim 4, wherein the shunt circuit comprises a shunt transistor coupled between the second voltage node and the reference node, wherein the set-reset latch is configured to cause activation of the shunt transistor responsive to the set signal being asserted to the set input of the set-reset latch.

6. The circuit as recited in claim 2, further comprising a second current mirror, wherein the second current mirror is configured to cause a gate terminal of the pass transistor to be pulled up toward a voltage present on third voltage node by a voltage amount that is proportional to the reverse current sensed by the sensing circuit.

7. The circuit as recited in claim 1, further comprising a power switch, wherein the power switch includes the pass transistor.

8. The circuit as recited in claim 1, further comprising a voltage regulator, wherein the voltage regulator includes the pass transistor.

9. The circuit of claim 1, further comprising an over voltage protection circuit configured to cause activation of the shunt circuit in response to detecting that a voltage on the second voltage node is greater than a voltage on the first voltage node.

10. The circuit of claim 9, wherein the over voltage protection circuit comprises a voltage divider coupled to the second voltage node, and a comparator having an first input coupled to the voltage divider and a second input coupled to receive a reference voltage, and wherein the shunt circuit includes an OR gate having a first input coupled to receive an output from the amplifier, a second input coupled to receive an indication from the sensing circuit that the reverse current exceeds the threshold value, and a shunt transistor coupled between the second voltage node and the reference node, wherein a gate terminal of the shunt transistor is coupled to an output of the OR gate.

11. A method comprising:
power circuitry providing an output voltage through a first pass transistor, the first pass transistor being coupled between a first voltage node and a second voltage node, and wherein the output voltage is provided on the second voltage node;
a sensing circuit sensing an amount of reverse current flowing through the first pass transistor from the second voltage node to the first voltage node;
activating a shunt circuit responsive to the sensing circuit detecting that the amount of reverse current exceeds a threshold value, wherein the sensing circuit includes a sense transistor and a current steering circuit, wherein the current steering circuit is configured to generate a current based on an amount of reverse current detected;
providing, from the current steering circuit, a first current to a first current mirror;
the first current mirror providing a second current based on the first current; and
redirecting at least a portion of the reverse current to a reference node responsive to activation of the shunt circuit.

12. The method as recited in claim 11, further comprising:
a current source providing a third current opposing the second current; and
the sensing circuit causing assertion of a set signal to a set-reset latch responsive to the second current exceeding the third current.

13. The method as recited in claim 12, further comprising:
the set-reset latch causing activation of a shunt transistor of the shunt circuit responsive to assertion of the set signal; and
the shunt transistor shunting current from the second voltage node to the reference node responsive to activation.

14. The method as recited in claim 12, further comprising a second current mirror pulling a voltage present on a gate terminal of the pass transistor up toward a voltage present on a third voltage node, the second current mirror being coupled to the first current mirror, wherein an increase in voltage on the gate terminal of the pass transistor is based on an amount of current provided from the first current mirror.

15. The method of claim 11, further comprising activating the shunt circuit in response to an over voltage protection circuit detecting that a voltage on the second voltage node is greater than a voltage on the first voltage node.

16. An integrated circuit comprising:
a power circuit, wherein the power circuit comprises a pass transistor coupled between a first voltage node and a second voltage node;
a reverse current sensing circuit, the reverse current sensing circuit comprising:
a sensing circuit configured to sense an amount of reverse current, the reverse current being a current fed back through the pass transistor to the first voltage node, wherein the sensing circuit includes a sense transistor, an amplifier having a non-inverting input coupled to the first voltage node and an inverting input coupled to a source terminal of the sense transistor, wherein a drain terminal of the sense transistor is coupled to the second voltage node, a current steering transistor having a source terminal coupled to the source terminal of the sense transistor and a gate terminal coupled to an output of the amplifier and a first current mirror coupled to receive a first current from the current steering transistor and configured to generate a second current based on the first current; and
a shunt circuit, wherein responsive to detecting that the reverse current exceeds a threshold value, the sensing circuit is configured to cause activation of the shunt circuit to redirect at least a portion of the reverse current to a reference node.

17. The integrated circuit as recited in claim 16, wherein the sensing circuit further comprises:
a current source configured to provide a third current opposing the second current; and
a set-reset latch, wherein responsive to the second current exceeding the third current, the reverse current sensing circuit is configured to cause a set signal to be asserted on a set input of the set-reset latch, and wherein responsive to assertion of the set signal, the set-reset latch is configured to cause activation of a shunt transistor in the shunt circuit, wherein the shunt transistor is configured to, when activated, shunt current between the second voltage node and the reference node.

18. The integrated circuit as recited in claim 16, further comprising a second current mirror coupled between the sensing circuit and a third voltage node, wherein the second current mirror is configured to cause a voltage present on a gate terminal of the pass transistor to be pulled up toward a voltage present on the third voltage node, wherein an increase in voltage on the gate terminal of the pass transistor is based on an amount of current provided from the first current mirror to the second current mirror.

19. The integrated circuit as recited in claim 16, wherein the power circuit includes at least one of the following:
a power switch configured to selectively couple the first voltage node to the second voltage node; and
a voltage regulator configured to provide a regulated output voltage.

20. The integrated circuit of claim 16, further comprising an over voltage protection circuit configured to cause activation of the shunt circuit in response to detecting that a voltage on the second voltage node is greater than a voltage on the first voltage node.

* * * * *